(12) United States Patent
Maruyama

(10) Patent No.: US 11,509,265 B2
(45) Date of Patent: Nov. 22, 2022

(54) INTEGRATED CIRCUIT, OSCILLATOR, ELECTRONIC APPARATUS, AND VEHICLE

(71) Applicant: Seiko Epson Corporation, Toyko (JP)

(72) Inventor: Yasuo Maruyama, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/329,267

(22) Filed: May 25, 2021

(65) Prior Publication Data

US 2021/0376791 A1 Dec. 2, 2021

(30) Foreign Application Priority Data

May 26, 2020 (JP) .............................. JP2020-091103

(51) Int. Cl.
*H03B 5/04* (2006.01)
*H03B 5/32* (2006.01)
*H03L 1/02* (2006.01)

(52) U.S. Cl.
CPC ................. *H03B 5/04* (2013.01); *H03B 5/32* (2013.01); *H03L 1/02* (2013.01)

(58) Field of Classification Search
CPC ..................................................... H03B 5/04
USPC ........................................................ 331/66
See application file for complete search history.

(56) References Cited

U.S. PATENT DOCUMENTS

| 2016/0218718 | A1 | 7/2016 | Yamamoto |
| 2016/0218719 | A1 | 7/2016 | Yamamoto |
| 2017/0272082 | A1* | 9/2017 | Obata ..................... H03L 1/028 |
| 2018/0108627 | A1* | 4/2018 | Yamamoto .............. H01L 24/06 |

FOREIGN PATENT DOCUMENTS

| JP | 2006-191517 A | 7/2006 |
| JP | 2013-183212 A | 9/2013 |
| JP | 2014-150453 A | 8/2014 |
| JP | 2016-134888 A | 7/2016 |
| JP | 2016-134889 A | 7/2016 |

\* cited by examiner

*Primary Examiner* — Joseph Chang
(74) *Attorney, Agent, or Firm* — Harness, Dickey & Pierce, P.L.C.

(57) ABSTRACT

An integrated circuit includes a first coupling terminal and a second coupling terminal disposed along a first side, an oscillation circuit which is electrically coupled to a resonator element via the first coupling terminal and the second coupling terminal, a temperature sensor, a temperature compensation circuit configured to compensate a temperature characteristic of the resonator element based on an output signal of the temperature sensor, and an output circuit to which a signal output from the oscillation circuit is input, and which is configured to output an oscillation signal, wherein d1<d0 and d2<d0, in which an end-to-end distance between the temperature sensor and the output circuit is d0, an end-to-end distance between the first coupling terminal and the output circuit is d1, and an end-to-end distance between the second coupling terminal and the output circuit is d2.

15 Claims, 10 Drawing Sheets

US 11,509,265 B2

INTEGRATED CIRCUIT, OSCILLATOR, ELECTRONIC APPARATUS, AND VEHICLE

The present application is based on, and claims priority from JP Application Serial Number 2020-091103, filed May 26, 2020, the disclosure of which is hereby incorporated by reference herein in its entirety.

BACKGROUND

1. Technical Field

The present disclosure relates to an integrated circuit, an oscillator, an electronic apparatus, and a vehicle.

2. Related Art

In the temperature-compensated crystal oscillator (TCXO) described in JP-A-2006-191517 (Document 1), a temperature sensor in an integrated circuit is disposed in the vicinity of a coupling terminal electrically coupled to a resonator element to thereby achieve reduction in difference between the temperature of the resonator element and the temperature sensed by the temperature sensor.

However, in the oscillator in Document 1, the behavior at the time of startup is not considered although the difference described above in the steady state can be reduced. In the layout of the oscillator in Document 1, the time taken for the heat from an output circuit high in amount of heat generation to be transferred to the resonator element becomes longer than the time taken for the heat from the output circuit to be transferred to the temperature sensor. Therefore, the difference between the time taken for temperature convergence of the resonator element after the startup and the time taken for temperature convergence of the temperature sensor becomes large. Thus, the time from the startup until the frequency of the output signal is stabilized becomes long.

SUMMARY

An integrated circuit according to an aspect of the present disclosure includes a first coupling terminal and a second coupling terminal disposed along a first side, an oscillation circuit which is electrically coupled to a resonator element via the first coupling terminal and the second coupling terminal, a temperature sensor, a temperature compensation circuit configured to compensate a temperature characteristic of the resonator element based on an output signal of the temperature sensor, and an output circuit to which a signal output from the oscillation circuit is input, and which is configured to output an oscillation signal, wherein $d1<d0$ and $d2<d0$, in which an end-to-end distance between the temperature sensor and the output circuit is d0, an end-to-end distance between the first coupling terminal and the output circuit is d1, and an end-to-end distance between the second coupling terminal and the output circuit is d2.

An oscillator according to another aspect of the present disclosure includes an integrated circuit, and a resonator element electrically coupled to the integrated circuit, wherein the integrated circuit includes a first coupling terminal and a second coupling terminal disposed along a first side, an oscillation circuit which is electrically coupled to the resonator element via the first coupling terminal and the second coupling terminal, a temperature sensor, a temperature compensation circuit configured to compensate a temperature characteristic of the resonator element based on an output signal of the temperature sensor, and an output circuit to which a signal output from the oscillation circuit is input, and which is configured to output an oscillation signal, and $d1<d0$ and $d2<d0$, in which an end-to-end distance between the temperature sensor and the output circuit is d0, an end-to-end distance between the first coupling terminal and the output circuit is d1, and an end-to-end distance between the second coupling terminal and the output circuit is d2.

An electronic apparatus according to another aspect of the present disclosure includes the oscillator described above, and a processing circuit configured to operate based on the oscillation signal.

A vehicle according to another aspect of the present disclosure includes the oscillator described above, and a processing circuit configured to operate based on the oscillation signal.

DESCRIPTION OF EXEMPLARY EMBODIMENTS

Hereinafter, some preferred embodiments of an integrated circuit, an oscillator, an electronic apparatus, and a vehicle according to the present disclosure will be described in detail based on the accompanying drawings.

First Embodiment

Figure 1:
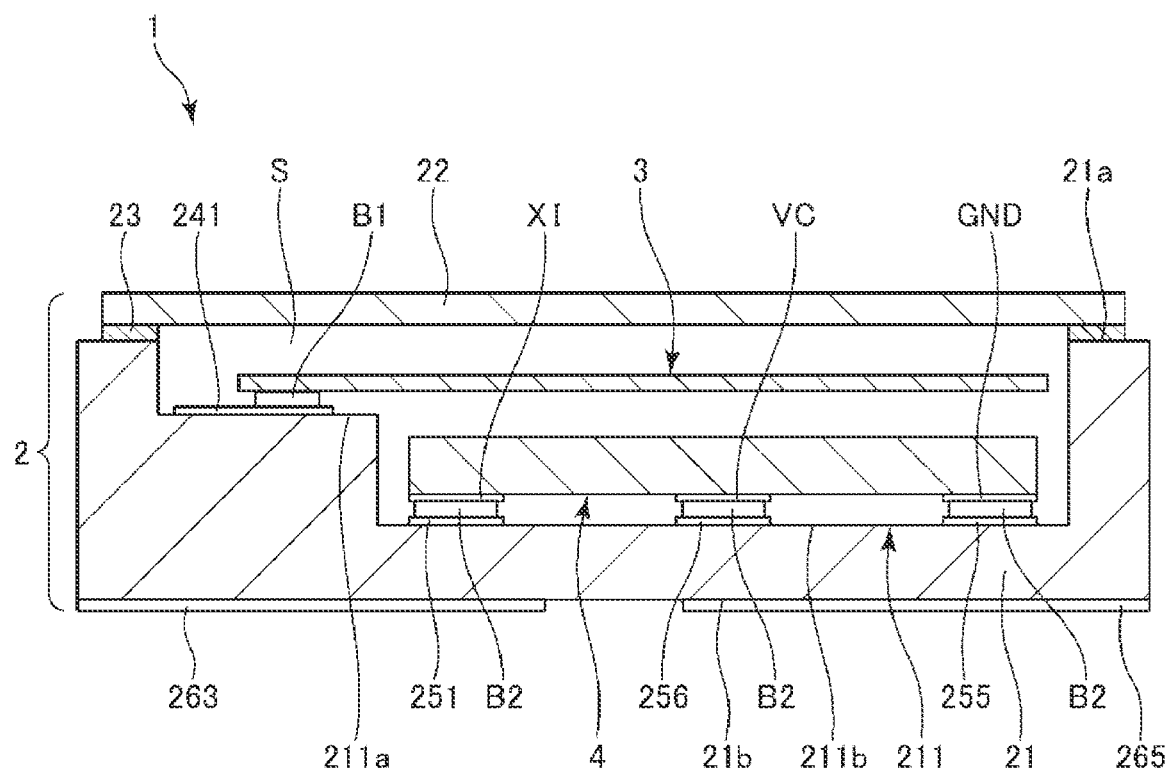
FIG. 1 is a cross-sectional view showing an oscillator according to a first embodiment.
Figure 2:
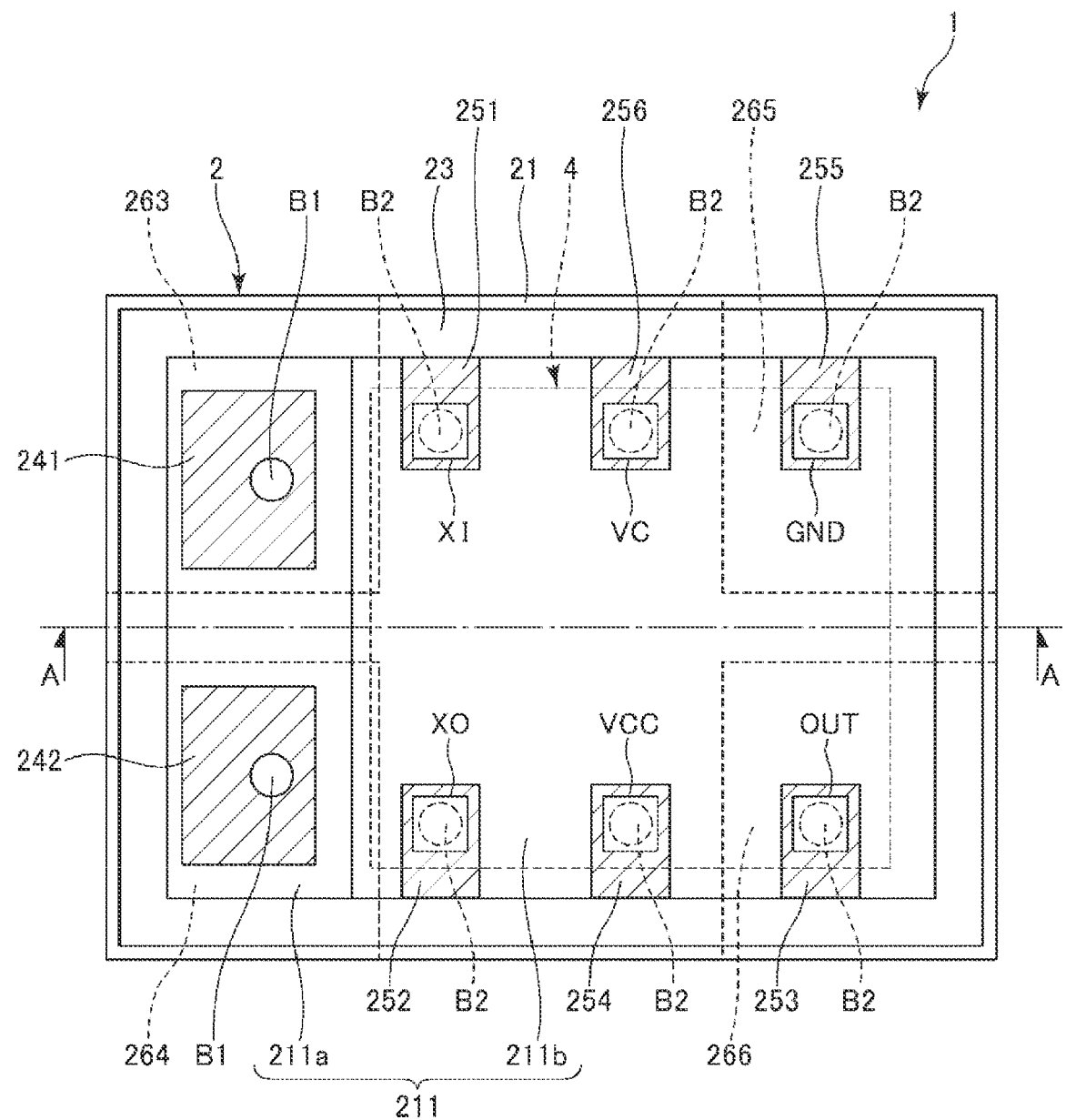
FIG. 2 is a plan view showing the oscillator shown in FIG. 1.
Figure 3:
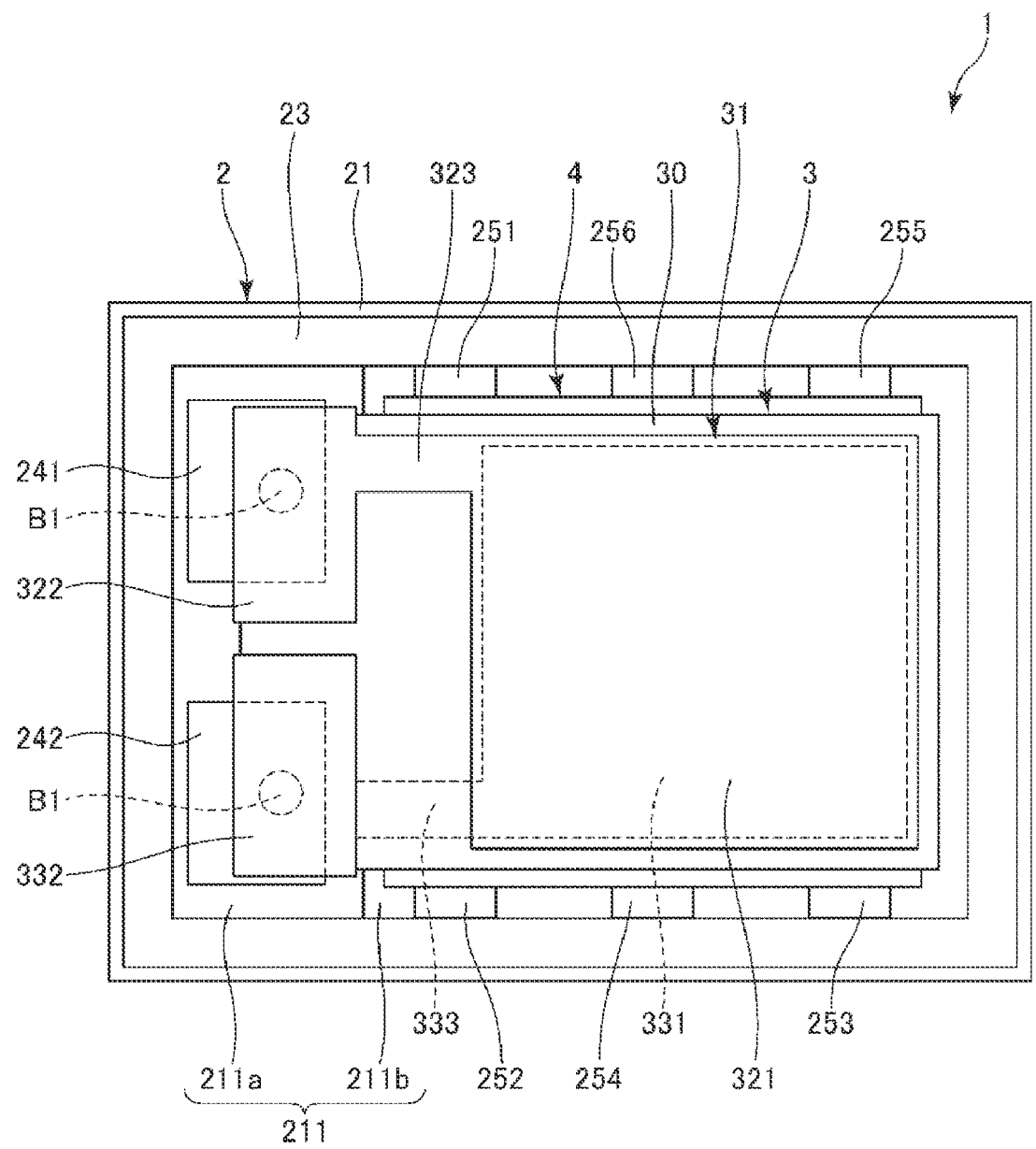
FIG. 3 is a plan view showing the oscillator shown in FIG. 1.
Figure 4:
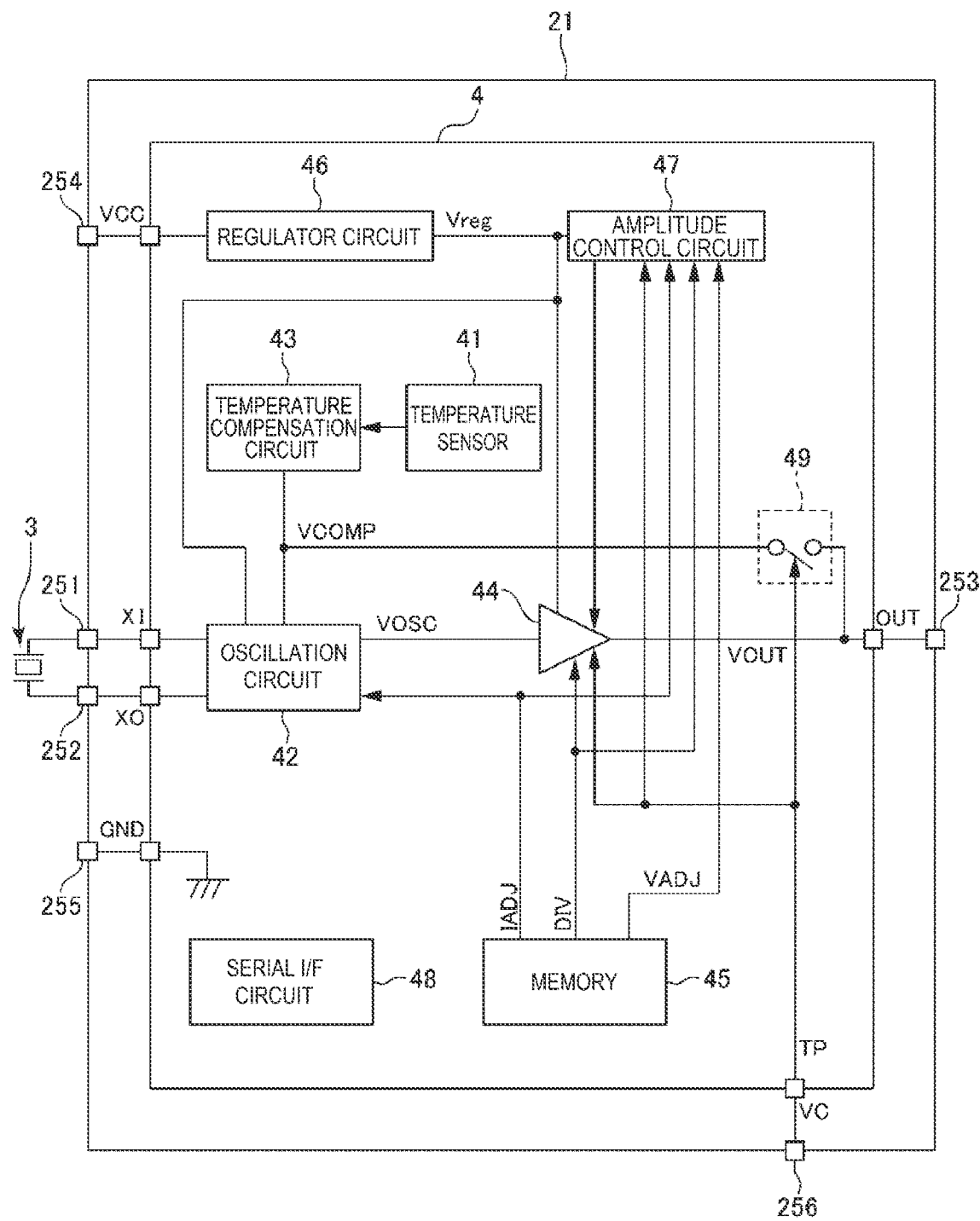
FIG. 4 is a block diagram showing an integrated circuit provided to the oscillator shown in FIG. 1.
Figure 5:
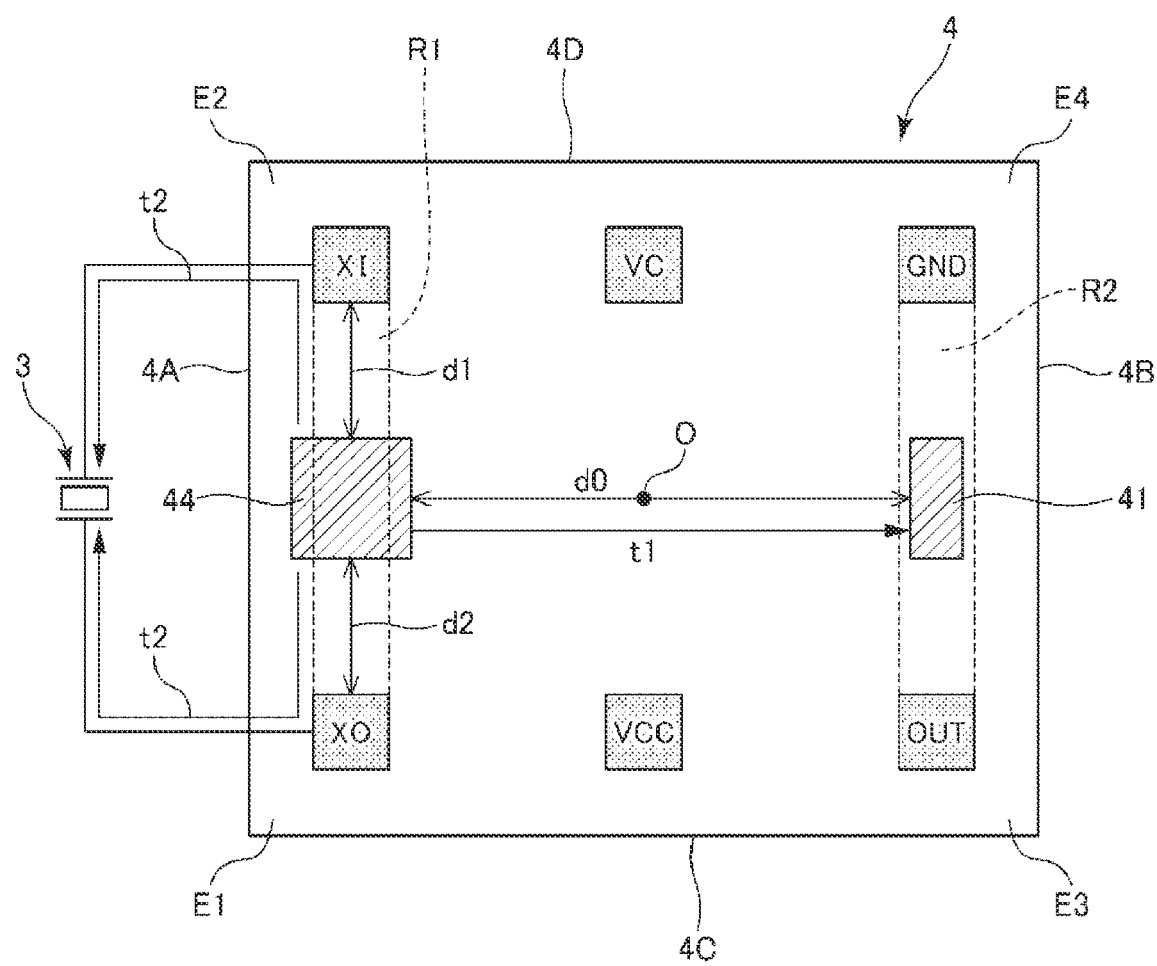
FIG. 5 is a plan view showing an arrangement of an output circuit and a temperature sensor in the integrated circuit.

FIG. 1 is a cross-sectional view showing an oscillator according to a first embodiment. FIG. 2 and FIG. 3 are each a plan view showing the oscillator shown in FIG. 1. FIG. 4 is a block diagram showing an integrated circuit provided to the oscillator shown in FIG. 1. FIG. 5 is a plan view showing an arrangement of an output circuit and a temperature sensor in the integrated circuit. It should be noted that FIG. 1 is a cross-sectional view along the line A-A in FIG. 2. Further, an upper side in FIG. 1 is also referred to as an "upper side," and a lower side thereof is also referred to as a "lower side" in the following descriptions for the sake of convenience of explanation.

The oscillator 1 shown in FIG. 1 is a temperature-compensated crystal oscillator, and has a package 2, and a resonator element 3 and an integrated circuit 4 housed in the package 2.

The package 2 has a base 21 provided with a recessed part 211 opening in an upper surface 21a, and a lid 22 which is bonded to the upper surface 21a of the base 21 via a bonding member 23 so as to close the opening of the recessed part 211. Further, by the lid 22 closing the opening of the recessed part 211, an internal space S as an airtight space is formed inside the package 2, and the resonator element 3 and the integrated circuit 4 are housed in the internal space S. Thus, it is possible to protect the integrated circuit 4 and the resonator element 3 from an impact and an external environment, in particular, dust, water, moisture, and so on. It should be noted that the base 21 can be formed of ceramics such as alumina, and the lid 22 can be formed of a metal material such as Kovar although not particularly limited.

The atmosphere in the internal space S is not particularly limited, but is preferably replaced with an inert gas such as nitrogen or argon, and is in a reduced pressure state in which the pressure is reduced with respect to the atmospheric pressure, further preferably in a state approximate to a vacuum. Thus, the viscous resistance is reduced, and the Q-value of the resonator element 3 can effectively be decreased, and thus, the oscillation characteristics of the resonator element 3 are improved. It should be noted that the atmosphere in the internal space S is not limited thereto, but can also be in an atmospheric pressure state or a pressurized state.

Further, the recessed part 211 is constituted by a plurality of recessed parts, and has a recessed part 211a opening in an upper surface of the base 21, and a recessed part 211b which opens in a bottom surface of the recessed part 211a, and which is smaller in opening than the recessed part 211a. Further, to the bottom surface of the recessed part 211a, there is fixed the resonator element 3, and to a bottom surface of the recessed part 211b, there is fixed the integrated circuit 4. Further, as shown in FIG. 2, on the bottom surface of the recessed part 211a, there are disposed internal terminals 241, 242. Further, on the bottom surface of the recessed part 211b, there are disposed six internal terminals 251, 252, 253, 254, 255, and 256. Further, on a lower surface of the base 21, there are disposed four external terminals 263, 264, 265, and 266.

Further, the internal terminal 251 and the internal terminal 241, the internal terminal 252 and the internal terminal 242, the internal terminal 253 and the external terminal 263, the internal terminal 254 and the external terminal 264, the internal terminal 255 and the external terminal 265, and the internal terminal 256 and the external terminal 266 are each electrically coupled to each other via an internal interconnection not shown formed in the base 21. Further, the internal terminals 241, 242 are each electrically coupled to the resonator element 3 via a bonding member B1 having electrical conductivity. Further, the internal terminals 251 through 256 are each electrically coupled to the integrated circuit 4 via a bonding member B2 having electrical conductivity. It should be noted that the method of coupling the constituents is not particularly limited.

Further, the bonding members B1, B2 are not particularly limited as long as both of the electrical conductivity and the bonding property are provided, and it is possible to use, for example, a variety of metal bumps such as gold bumps, silver bumps, copper bumps, or solder bumps, or an electrically conductive adhesive having an electrically conductive filler such as a silver filler dispersed in a variety of adhesives such as a polyimide type adhesive, an epoxy type adhesive, a silicone type adhesive, or an acrylic adhesive. When using the metal bumps which are in the former group as the bonding members B1, B2, it is possible to suppress generation of a gas from the bonding members B1, B2, and it is possible to effectively prevent a change in environment, in particular rise in pressure, of the internal space S. Further, since excellent thermal conductivity is provided, it also becomes easy for the heat of the integrated circuit 4 to be transferred to the resonator element 3. On the other hand, when using the electrically conductive adhesive which is in the latter group as the bonding members B1, B2, the bonding members B1, B2 become soft compared to the metal bumps, and it becomes difficult for a stress to reach the resonator element 3 from the base 21.

Further, the resonator element 3 is an AT-cut quartz crystal resonator element. The AT-cut quartz crystal resonator element has third-order frequency-temperature characteristic, and is therefore excellent in frequency stability. As shown in FIG. 3, the resonator element 3 has a quartz crystal substrate 30 which is carved out as an AT-cut substrate and has a rectangular shape, and electrodes 31 disposed on respective surfaces of the quartz crystal substrate 30. Further, the electrodes 31 include a first excitation electrode 321 disposed on an upper surface of the quartz crystal substrate 30, and a second excitation electrode 331 which is disposed on a lower surface of the quartz crystal substrate 30, and is opposed to the first excitation electrode 321 via the quartz crystal substrate 30. Further, the electrodes 31 include a first pad electrode 322 and a second pad electrode 332 disposed on the lower surface of the quartz crystal substrate 30 so as to be arranged side by side in an edge part of the quartz crystal substrate 30, a first extraction electrode 323 to electrically couple the first excitation electrode 321 and the first pad electrode 322 to each other, and a second extraction electrode 333 to electrically couple the second excitation electrode 331 and the second pad electrode 332 to each other.

It should be noted that the configuration of the resonator element 3 is not particularly limited. For example, the planar shape of the quartz crystal substrate 30 is not limited to the rectangular shape. Further, as the resonator element 3, there can be used an SC-cut quartz crystal resonator element, a BT-cut quartz crystal resonator element, a tuning-fork type quartz crystal resonator element, a surface acoustic wave resonator, or other piezoelectric resonator elements, an MEMS (Micro Electro Mechanical Systems) resonator element, and so on besides the AT-cut quartz crystal resonator element.

Further, instead of the quartz crystal substrate 30, it is possible to use a variety of types of piezoelectric substrates made of, for example, lithium niobate ($LiNbO_3$), lithium tantalate ($LiTaO_3$), lead zirconium titanate (PZT), lithium tetraborate ($Li_2B_4O_7$), langasite crystal ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbTiO_3$), sodium potassium niobate ($(K, Na)NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), or it is possible to use a substrate other than the piezoelectric substrate such as a silicon substrate.

Such a resonator element 3 is bonded to the bottom surface of the recessed part 211a via a pair of the bonding members B1. Further, one of the bonding members B1 has contact with the internal terminal 241 and the first pad electrode 322 to electrically couple them to each other.

Further, the other of the bonding members B1 has contact with the internal terminal 242 and the second pad electrode 332 to electrically couple them to each other.

As shown in FIG. 4, the integrated circuit 4 has a temperature sensor 41, an oscillation circuit 42, a temperature compensation circuit 43, an output circuit 44, a memory 45, a regulator circuit 46, an amplitude control circuit 47, a serial interface circuit 48, and a switch circuit 49. Further, the integrated circuit 4 has six terminals disposed on the lower surface thereof, specifically, an XI terminal as a first coupling terminal, an XO terminal as a second coupling terminal, an OUT terminal as a third coupling terminal, a VCC terminal as a fourth coupling terminal, a GND terminal as a fifth coupling terminal, and a VC terminal as a sixth coupling terminal. As shown in FIG. 2, such an integrated circuit 4 is bonded to the bottom surface of the recessed part 211b via the bonding members B2. Further, the XI terminal and the internal terminal 251, the XO terminal and the internal terminal 252, the OUT terminal and the internal terminal 253, the VCC terminal and the internal terminal 254, the GND terminal and the internal terminal 255, and the VC terminal and the internal terminal 256 are each electrically coupled to each other via the bonding member B2.

The oscillation circuit 42 is electrically coupled to the resonator element 3 via the XI terminal and the XO terminal. The oscillating circuit 42 is a circuit for oscillating the resonator element 3, and amplifies the output signal of the resonator element 3 and feeds the output signal thus amplified back to the resonator element 3. Further, the oscillation circuit 42 outputs an oscillation signal VOSC based on the oscillation of the resonator element 3. The temperature sensor 41 detects the temperature of the integrated circuit 4 to output a temperature signal having a voltage corresponding to the temperature.

The temperature compensation circuit 43 is a circuit for compensating the temperature characteristic of the resonator element 3 based on the output signal of the temperature sensor 41. In the present embodiment, the temperature compensation circuit 43 generates a temperature compensation voltage VCOMP based on the temperature signal output from the temperature sensor 41, and a coefficient value corresponding to the frequency-temperature characteristic of the resonator element 3 stored in the memory 45. The temperature compensation voltage VCOMP is applied to one end of a variable capacitance element not shown which functions as a load capacitance of the oscillation circuit 42, and thus, the oscillation frequency is controlled. It should be noted that the temperature compensation circuit 43 can be a circuit which converts the frequency of the oscillation signal VOSC output from the oscillation circuit 42 in accordance with the temperature characteristic of the resonator element 3 to thereby compensate the temperature characteristic of the resonator element 3. Such a circuit is realized by, for example, a fractional-N PLL circuit.

To the output circuit 44, there is input the oscillation signal VOSC output from the oscillation circuit 42, and the output circuit 44 outputs an oscillation signal VOUT. For example, when the oscillator 1 is used as an oscillator for the purpose of GPS used for a cellular system or the like, there is required such a high frequency-temperature compensation accuracy as ±0.5 ppm. Therefore, in the present embodiment, the output voltage amplitude of the output circuit 44 is stabilized with the regulator circuit 46, and at the same time, the output circuit 44 outputs the oscillation signal VOUT having a clipped sine waveform with the output amplitude suppressed from a viewpoint of reduction in current consumption. The regulator circuit 46 generates a constant voltage Vreg to be a power supply voltage or a reference voltage for the oscillation circuit 42, the temperature compensation circuit 43, the output circuit 44, and so on based on the power supply voltage supplied from the VCC terminal.

The amplitude control circuit 47 is a circuit for controlling the amplitude of the oscillation signal VOUT output by the output circuit 44. Further, in the memory 45, there are stored oscillation stage current adjustment data IADJ for adjusting/selecting an oscillation stage current of the oscillation circuit 42 in accordance with the frequency of the resonant element 3, frequency division switching data DIV for selecting whether to divide the frequency of the oscillation signal VOSC by a frequency divider circuit disposed inside the output circuit 44 and then output the result, and output level adjustment data VADJ for adjusting the amplitude level of the oscillation signal VOUT as the clipped sine wave output by the output circuit 44. These data are stored in the memory 45 in a manufacturing process of the oscillator 1. Further, in the manufacturing process of the oscillator 1, in the memory 45, there are also stored coefficient values of zero-order, first-order, third-order, and so on which are not shown and correspond to the frequency-temperature characteristic of the resonator element 3.

Such a memory 45 is configured so that read/write operations can be achieved via the serial interface circuit 48. It should be noted that in the present embodiment, the integrated circuit 4 only has four terminals, namely the VCC terminal, the GND terminal, the OUT terminal, and the VC terminal, except the XI terminal and the XO terminal to be coupled to the resonator element 3. Therefore, the serial interface circuit 48 accepts the clock signal externally input from the VC terminal and the data signal externally input from the OUT terminal, and then performs the read/write operations of the data on the memory 45 when, for example, the voltage at the VCC terminal is higher than a threshold value.

The switch circuit 49 is a circuit for switching the electrical coupling between the temperature compensation circuit 43 and the OUT terminal which is electrically coupled to the output side of the output circuit 44. For example, in an inspection process before shipment of the oscillator 1, it is possible to input a test signal TP at a low level or a high level to the VC terminal, and after the inspection process is completed, the VC terminal is grounded, and the test signal TP is fixed to the low level. When the test signal TP to be input to the VC terminal is at the low level, the switch circuit 49 does not electrically couple the temperature compensation circuit 43 and the OUT terminal to each other, and thus, the oscillation signal VOUT output from the output circuit 44 is output to the OUT terminal. Further, when the test signal TP is at the high level, the switch circuit 49 electrically couples the temperature compensation circuit 43 and the OUT terminal to each other, and thus, output of the oscillation signal VOUT from the output circuit 44 is stopped, and the temperature compensation voltage VCOMP is output to the OUT terminal.

The circuit configuration of the integrated circuit 4 is hereinabove described. Then, the arrangement of the output circuit 44 and the temperature sensor 41 as one of the features of the oscillator 1 will be described. In the oscillator 1, the arrangement of the output circuit 44 and the temperature sensor 41 is devised so that the time needed for the resonator element 3 and the temperature sensor 41 to become in a thermal equilibrium state from the time of startup becomes short.

As shown in FIG. 5, the integrated circuit 4 has a substantially rectangular shape in a plan view. Therefore, the contour of the integrated circuit 4 includes a first side 4A and a second side 4B which extend in parallel to each other, and which are disposed at a distance, and a third side 4C and a fourth 4D which extend in a direction perpendicular to the direction in which the first side 4A and the second side 4B extend, and which are disposed at a distance from each other. It should be noted that the third side 4C couples one ends of the first side 4A and the second side 4B to each other, and the fourth side 4D couples the other ends of the first side 4A and the second side 4B to each other. Further, the XI terminal, the VC terminal, and the GND terminal are arranged side by side along the fourth side 4D, and the XO terminal, the VCC terminal, and the OUT terminal are arranged side by side along the third side 4C. Further, the XI terminal and the XO terminal are disposed along the first side 4A, and the GND terminal and the OUT terminal are disposed along the second side 4B.

In other words, the XO terminal is disposed at a corner part E1 formed by first side 4A and the third side 4C, the XI terminal is disposed at a corner part E2 formed by the first side 4A and the fourth side 4D, the OUT terminal is disposed at a corner part E3 formed by the second side 4B and the third side 4C, the GND terminal is disposed at a corner part E4 formed by the second side 4B and the fourth side 4D, the VC terminal is disposed between the XI terminal and the GND terminal, and the VCC terminal is disposed between the XO terminal and the OUT terminal. By adopting such an arrangement, it is possible to dispose the six terminals on the lower surface of the integrated circuit 4 in a balanced manner.

It should be noted that the planar shape of the integrated circuit 4 is not particularly limited providing the planar shape has the first side 4A, and can be, for example, a triangular shape, a quadrangular shape other than the rectangular shape, a polygonal shape with five or more vertexes, an oval shape, or an irregular shape.

Further, in the integrated circuit 4, defining the end-to-end distance between the temperature sensor 41 and the output circuit 44 as d0, the end-to-end distance between the XI terminal and the output circuit 44 as d1, and the end-to-end distance between the XO terminal and the output circuit 44 as d2, the relationships d1<d0 and d2<d0 are fulfilled. It should be noted that the "end-to-end distance" described above means the shortest distance in the plan view. Here, among the variety of circuits included in the integrated circuit 4, the output circuit 44 is particularly apt to generate heat. Therefore, the output circuit 44 becomes a major heat source of the integrated circuit 4, and the frequency of the oscillation signal VOUT is stabilized when the heat generated by the heat source is transferred to the temperature sensor 41 and the resonator element 3 and these become in the thermal equilibrium state.

Here, the heat generated in the output circuit 44 is transferred to the temperature sensor 41 passing mainly inside the integrated circuit 4. Meanwhile, the heat generated in the output circuit 44 passes mainly inside the integrated circuit 4, and is transferred to the resonator element 3 from the XI terminal and the XO terminal via the internal interconnections disposed inside the base 21. Therefore, the heat transfer path t2 from the output circuit 44 to the resonator element 3 is apt to become longer than the heat transfer path t1 from the output circuit 44 to the temperature sensor 41. As a result, the time T2 from the startup until the output circuit 44 and the resonator element 3 become in the thermal equilibrium state is apt to become longer than the time T1 from the startup until the output circuit 44 and the temperature sensor 41 become in the thermal equilibrium state.

Therefore, in the oscillator 1, the output circuit 44 is disposed closer to the XI terminal and the XO terminal than to the temperature sensor 41. Thus, it is possible to extend the heat transfer path t1 and to shorten the heat transfer path t2, and thus, it is possible to decrease the difference between the heat transfer paths t1, t2. Therefore, it is possible to reduce the difference ΔT between the times T1, T2. Therefore, the temperature sensor and the resonator element 3 become in the thermal equilibrium state in a shorter time, and the frequency of the oscillation signal VOUT of the oscillator 1 is stabilized in a shorter time from the time of the startup. Further, since the difference in degree of rise in temperature between the resonator element 3 and the temperature sensor 41 also decreases, the temperature difference between the resonator element 3 and the temperature sensor 41 in the period from the startup until the thermal equilibrium state is achieved can also be suppressed to a low level. Therefore, it is also possible to reduce the frequency deviation of the oscillation signal VOUT in the period from the startup until the thermal equilibrium state is achieved.

In particular, the XI terminal and the XO terminal are each disposed along the first side 4A located at the bonding member B1 side. Therefore, the internal interconnection for electrically coupling the XI terminal and the internal terminal 241, and the internal interconnection for electrically coupling the XO terminal and the internal terminal 242 can be made shorter. Therefore, it is possible to make the difference ΔT smaller. As a result, the temperature sensor 41 and the resonator element 3 become in the thermal equilibrium state in a shorter time, and the frequency of the oscillation signal VOUT of the oscillator 1 is stabilized in a shorter time from the time of the startup. Further, in the present embodiment, d1=d2 is fulfilled, and thus, the heat of the output circuit 44 is transferred to the resonator element 3 via the XI terminal and the XO terminal in a balanced manner. Therefore, it is possible to further shorten the time T2, and it is possible to conspicuously exert the advantage described above. It should be noted that this is not a limitation, and it is also possible to fulfill d1≠d2.

It should be noted that the value of d0/d1 is designed taking the lengths of the internal interconnections, the cross-sectional area, the thermal conductivity, and so on into consideration so that the difference in degree of rise in temperature between the resonator element 3 and the temperature sensor 41 becomes small. For example, it is preferable to fulfill 1.5≤d0/d1≤5.0, it is more preferable to fulfill 2.0≤d0/d1≤4.5, and it is further more preferable to fulfill 2.5≤d0/d1≤3.5. The same applies to the value of d0/d2. Thus, the advantage described above becomes more conspicuous.

In particular, in the present embodiment, the output circuit 44 is located between the XI terminal and the XO terminal in the plan view of the integrated circuit 4. Thus, it is possible to dispose the output circuit 44 in the vicinity of the XI terminal and the XO terminal. Therefore, it is possible to make the end-to-end distances d1, d2 shorter, and thus, it is possible to make the difference ΔT smaller. It should be noted that the expression that the output circuit 44 is located between the XI terminal and the XO terminal means, for example, the state in which at least a part of the output circuit 44 overlaps an area R1 between the XI terminal and the XO terminal in the plan view of the integrated circuit 4. It should be noted that the arrangement of the output circuit 44 is not particularly limited, and the output circuit 44 is not required to overlap the area R1.

Further, in the present embodiment, the temperature sensor 41 is disposed at the second side 4B side of the center O of the integrated circuit 4 in the plan view of the integrated circuit 4. In other words, in the plan view of the integrated circuit 4, the temperature sensor 41 is disposed so as to be shifted toward the second side 4B at the opposite side to the first side 4A side where the XI terminal and the XO terminal are disposed. Thus, it is possible to dispose the output circuit 44 and the temperature sensor 41 at the longest possible distance from each other in the integrated circuit 4, and thus, it is possible to make the end-to-end distance d0 longer. Therefore, it is possible to make the difference between the heat transfer paths t1, t2 smaller, and thus, the temperature difference between the resonator element 3 and the temperature sensor 41 in the period until the thermal equilibrium state is achieved can be suppressed to a lower level. Therefore, the frequency deviation of the oscillation signal VOUT in the period until the thermal equilibrium state is achieved can be made smaller.

In particular, the temperature sensor 41 is disposed along the second side 4B, and is located between the GND terminal and the OUT terminal. Thus, it is possible to make the end-to-end distance d0 between the output circuit 44 and the temperature sensor 41 longer. It should be noted that the expression that the temperature sensor 41 is located between the GND terminal and the OUT terminal means, for example, the state in which at least a part of the temperature sensor 41 overlaps an area R2 between the GND terminal and the OUT terminal in the plan view of the integrated circuit 4. It should be noted that the arrangement of the temperature sensor 41 is not particularly limited, and the temperature sensor 41 is not required to overlap the area R2, or is not required to be shifted toward the second side 4B.

The arrangement of the output circuit 44 and the temperature sensor 41 is described hereinabove. As described above, the integrated circuit 4 described above has the XI terminal as the first coupling terminal and the XO terminal as the second coupling terminal disposed along the first side 4A, the oscillation circuit 42 electrically coupled to the resonator element 3 via the XI terminal and the XO terminal, the temperature sensor 41, the temperature compensation circuit 43 for compensating the temperature characteristic of the resonator element 3 based on the output signal of the temperature sensor 41, and the output circuit 44 to which the oscillation signal VOSC as the signal output from the oscillation circuit 42 is input, and which outputs the oscillation signal VOUT. Further, defining the end-to-end distance between the temperature sensor 41 and the output circuit 44 as d0, the end-to-end distance between the XI terminal and the output circuit 44 as d1, and the end-to-end distance between the XO terminal and the output circuit 44 as d2, d1<d0 and d2<d0 are fulfilled. In other words, the XI terminal and the XO terminal are each disposed closer to the output circuit 44 than to the temperature sensor 41.

Thus, the heat transfer path t2 from the output circuit 44 to the resonator element 3 becomes short, and thus, it is possible to shorten the time T2. Therefore, the difference ΔT between the times T1, T2 decreases. As a result, the temperature sensor 41 and the resonator element 3 become in the thermal equilibrium state in a shorter time, and thus, the frequency of the oscillation signal VOUT of the oscillator 1 is stabilized in a shorter time from the time of the startup. Further, the temperature difference between the resonator element 3 and the temperature sensor in the period from the startup until the thermal equilibrium state is achieved can also be suppressed to a low level. Therefore, the frequency deviation of the oscillation signal VOUT in the period from the startup until the thermal equilibrium state is achieved can be made smaller.

Further, as described above, the output circuit 44 is located between the XI terminal and the XO terminal in the plan view of the integrated circuit 4. Thus, it is possible to dispose the output circuit 44 in the vicinity of the XI terminal and the XO terminal. Therefore, it is possible to make the end-to-end distances d1, d2 shorter.

Further, as described above, the temperature sensor 41 is disposed so as to be shifted toward the second side 4B opposed to the first side 4A. Thus, it is possible to dispose the output circuit 44 and the temperature sensor 41 at the longest possible distance from each other in the integrated circuit 4. Therefore, it is possible to make the end-to-end distance d0 longer.

Further, as described above, the integrated circuit 4 has the OUT terminal as the third coupling terminal and the VCC terminal as the fourth coupling terminal disposed along the third side 4C which couples one ends of the first side 4A and the second side 4B opposed to the first side 4A to each other, and the GND terminal as the fifth coupling terminal and the VC terminal as the sixth coupling terminal disposed along the fourth side 4D which couples the other ends of the first side 4A and the second side 4B to each other. Thus, it is possible to dispose the six terminals in a balanced manner.

Further, as described above, the oscillator 1 has the integrated circuit 4, and the resonator element 3 which is electrically coupled to the integrated circuit 4 via the XI terminal and the XO terminal. Thus, the advantage of the integrated circuit 4 described above can be appreciated. Specifically, the heat generated in the output circuit 44 is transferred to the temperature sensor 41, and the difference ΔT between the times T1, T2 can be shortened. Therefore, the temperature sensor 41 and the resonator element 3 become in the thermal equilibrium state in a shorter time, and thus, the frequency of the oscillation signal VOUT of the oscillator 1 is stabilized in a shorter time from the time of the startup. Further, the temperature difference between the resonator element 3 and the temperature sensor 41 in the period from the startup until the thermal equilibrium state is achieved can be suppressed to a lower level. Therefore, the frequency deviation of the oscillation signal VOUT in the period from the startup until the thermal equilibrium state is achieved can be made smaller.

Further, as described above, the oscillator 1 has the base 21 provided with the recessed part 211, and the lid 22 bonded to the base 21 so as to close the opening of the recessed part 211, and the integrated circuit 4 and the resonator element 3 are disposed in the recessed part 211. Thus, it is possible to protect the integrated circuit 4 and the resonator element 3 from an impact and an external environment, in particular, dust, water, moisture, and so on.

Second Embodiment

Figure 6:
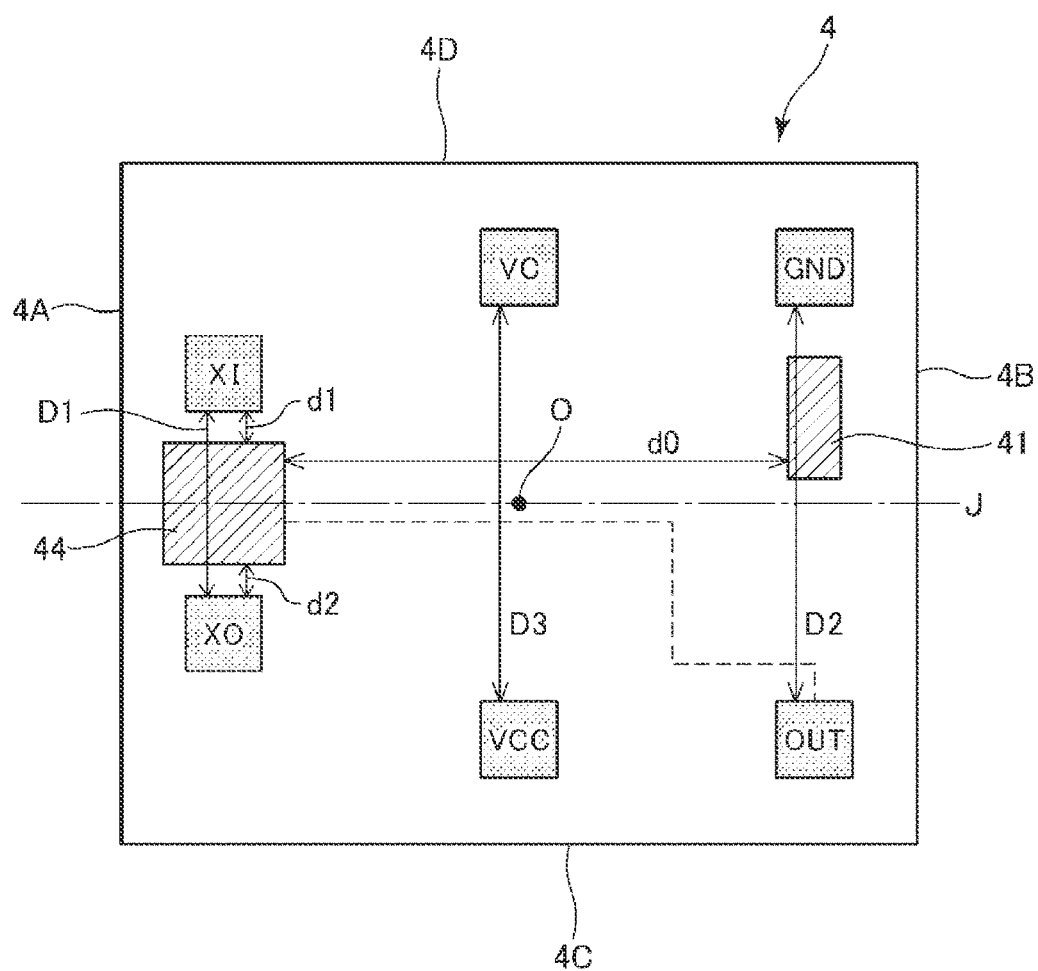
FIG. 6 is a plan view showing an arrangement of an output circuit and a temperature sensor in an integrated circuit according to a second embodiment.

FIG. 6 is a plan view showing an arrangement of an output circuit and a temperature sensor in an integrated circuit according to a second embodiment.

An oscillator 1 according to the present embodiment is substantially the same as the oscillator 1 according to the first embodiment described above except the point that the configuration of the integrated circuit 4 is different. It should be noted that in the following description, the oscillator 1 according to the second embodiment will be described with a focus on the difference from the first embodiment described above, and the description of substantially the same issues will be omitted. Further, in FIG. 6, constituents substantially the same as in the embodiment described above are denoted by the same reference symbols.

As shown in FIG. 6, in the integrated circuit 4 provided to the oscillator 1 according to the present embodiment, similarly to the first embodiment described above, the XI terminal and the XO terminal are disposed along the first side 4A, the output circuit 44 is disposed between these terminals, and the temperature sensor 41 is disposed so as to be shifted toward the second side 4B. Further, defining an axis passing through the center O of the integrated circuit 4 and perpendicular to the first side 4A as a central axis J in the plan view of the integrated circuit 4, the OUT terminal which is electrically coupled to the output circuit 44 and to which the oscillation signal VOUT is output, and the temperature sensor 41 are disposed across the central axis J. In other words, the temperature sensor 41 is shifted toward the fourth side 4D, the OUT terminal is located at one side, namely the third side 4C side, of the central axis J, and the temperature sensor 41 is located at the other side, namely the fourth side 4D side. Thus, it is possible to dispose the OUT terminal and the temperature sensor 41 at the longest possible distance from each other in the integrated circuit 4.

The OUT terminal is coupled to the output circuit 44 via the interconnection in the integrated circuit 4, and therefore, the heat of the output circuit 44 is easily transferred to the OUT terminal. Therefore, when the temperature sensor 41 is located in the vicinity of the OUT terminal, the temperature sensor 41 rises in temperature due to the heat of the OUT terminal, and thus, the time T1 is shortened. Therefore, there is a possibility that the difference ΔT between the times T1, T2 increases. Therefore, by disposing the OUT terminal and the temperature sensor 41 separately at both sides of the central axis J at the longest possible distance from each other as in the present embodiment, it is possible to make the heat of the OUT terminal difficult to be transferred to the temperature sensor 41 to thereby suppress the difference ΔT to a low level. Therefore, the temperature difference between the resonator element 3 and the temperature sensor 41 in the period until the thermal equilibrium state is achieved can be suppressed to a lower level, and thus, the frequency deviation of the oscillation signal VOUT in the period until the thermal equilibrium state is achieved can be made smaller.

Further, in the present embodiment, the XI terminal and the XO terminal, the VCC terminal and the VC terminal, and the OUT terminal and the GND terminal are each disposed in parallel to the first side 4A. Further, defining the end-to-end distance between the XI terminal and the XO terminal as D1, the end-to-end distance between the OUT terminal and the GND terminal as D2, and the end-to-end distance between the VCC terminal and the VC terminal as D3, relationships D1<D2 and D1<D3 are fulfilled. Thus, the end-to-end distances d1, d2 become short, and the time T2 is shortened. Therefore, the difference ΔT between the times T1, T2 can be made shorter. Therefore, the temperature difference between the resonator element 3 and the temperature sensor 41 in the period until the thermal equilibrium state is achieved can be suppressed to a lower level, and thus, the frequency deviation of the oscillation signal VOUT in the period until the thermal equilibrium state is achieved can be made smaller.

As described above, in the integrated circuit 4 according to the present embodiment, the OUT terminal is a terminal which is electrically coupled to the output circuit 44, and to which the oscillation signal VOUT is output. Further, defining the axis which is perpendicular to the first side 4A and passes through the center O of the integrated circuit 4 as the central axis J in the plan view of the integrated circuit 4, the OUT terminal is located at one side of the central axis J, and the temperature sensor 41 is located at the other side. Thus, it becomes difficult for the heat of the OUT terminal to be transferred to the temperature sensor 41, and thus, the difference ΔT can be suppressed to a low level. Therefore, the temperature difference between the resonator element 3 and the temperature sensor 41 in the period from the startup until the thermal equilibrium state is achieved can be suppressed to a lower level, and thus, the frequency deviation of the oscillation signal VOUT in the period until the thermal equilibrium state is achieved can be made smaller.

Further, as described above, the OUT terminal and the GND terminal, and the VCC terminal and the VC terminal are each disposed along a direction in which the XI terminal and the XO terminal are arranged. Further, defining the end-to-end distance between the XI terminal and the XO terminal as D1, the end-to-end distance between the OUT terminal and the GND terminal as D2, and the end-to-end distance between the VCC terminal and the VC terminal as D3, D1<D2 and D1<D3 are fulfilled. Thus, the end-to-end distances d1, d2 become short, and the time T2 is shortened. Therefore, the difference ΔT between the times T1, T2 can be made shorter. Therefore, the temperature difference between the resonator element 3 and the temperature sensor in the period from the startup until the thermal equilibrium state is achieved can be suppressed to a lower level, and thus, the frequency deviation of the oscillation signal VOUT in that period can be made smaller.

According also to such a second embodiment as described above, there can be exerted substantially the same advantages as in the first embodiment described above.

Third Embodiment

Figure 7:
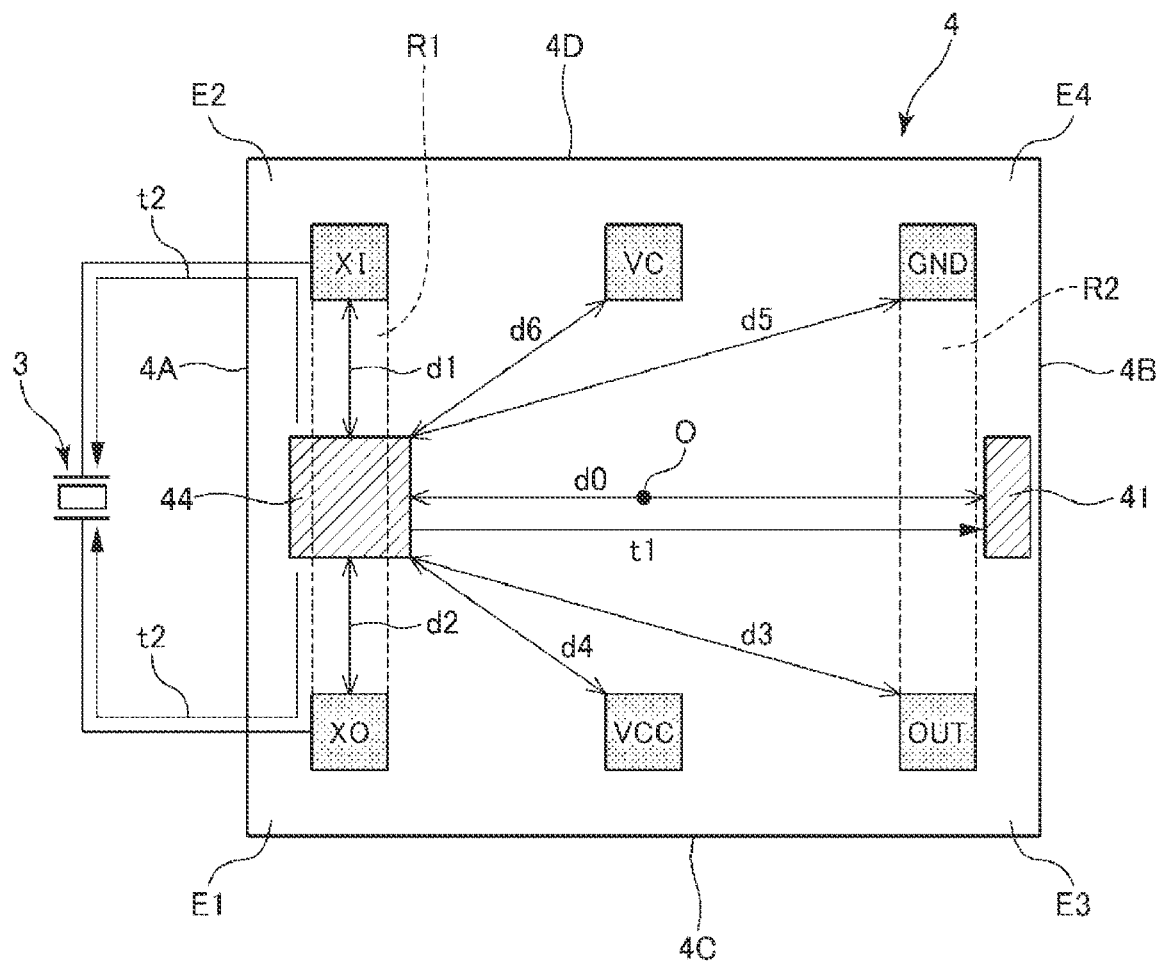
FIG. 7 is a plan view showing an arrangement of an output circuit and a temperature sensor in an integrated circuit according to a third embodiment.

FIG. 7 is a plan view showing an arrangement of an output circuit and a temperature sensor in an integrated circuit according to a third embodiment.

An oscillator 1 according to the present embodiment is substantially the same as the oscillator 1 according to the first embodiment described above except the point that the configuration of the integrated circuit 4 is different. It should be noted that in the following description, the oscillator 1 according to the third embodiment will be described with a focus on the difference from the first embodiment described above, and the description of substantially the same issues will be omitted. Further, in FIG. 7, constituents substantially the same as in the embodiment described above are denoted by the same reference symbols.

As shown in FIG. 7, in the integrated circuit 4 provided to the oscillator 1 according to the present embodiment, the temperature sensor 41 is disposed so as to be further shifted toward the second side 4B than in the first embodiment described above, and thus, the end-to-end distance d0 between the output circuit 44 and the temperature sensor 41 is made longer. Further, defining the end-to-end distance between the output circuit 44 and the VCC terminal as d4, and the end-to-end distance between the output circuit 44 and the VC terminal as d6, d4<d0 and d6<d0 are fulfilled. It should be noted that the "end-to-end distance" described above means the shortest distance in the plan view. Thus, the end-to-end distance d0 becomes longer, and the difference ΔT between the times T1, T2 decreases. Therefore, the difference in degree of rise in temperature between the resonator element 3 and the temperature sensor 41 becomes smaller, and the temperature difference between the resonator element 3 and the temperature sensor 41 in the period from the startup until the thermal equilibrium state is achieved can be suppressed to a lower level. Therefore, the frequency deviation of the oscillation signal VOUT in the period from the startup until the thermal equilibrium state is achieved can be made smaller. Further, defining the end-to-end distance between the output circuit 44 and the OUT terminal as d3, and the end-to-end distance between the output circuit 44 and the GND terminal as d5, d3<d0 and d5<d0 are fulfilled. Thus, the advantage described above becomes more conspicuous.

According also to such a third embodiment as described above, there can be exerted substantially the same advantages as in the first embodiment described above.

Fourth Embodiment

Figure 8:
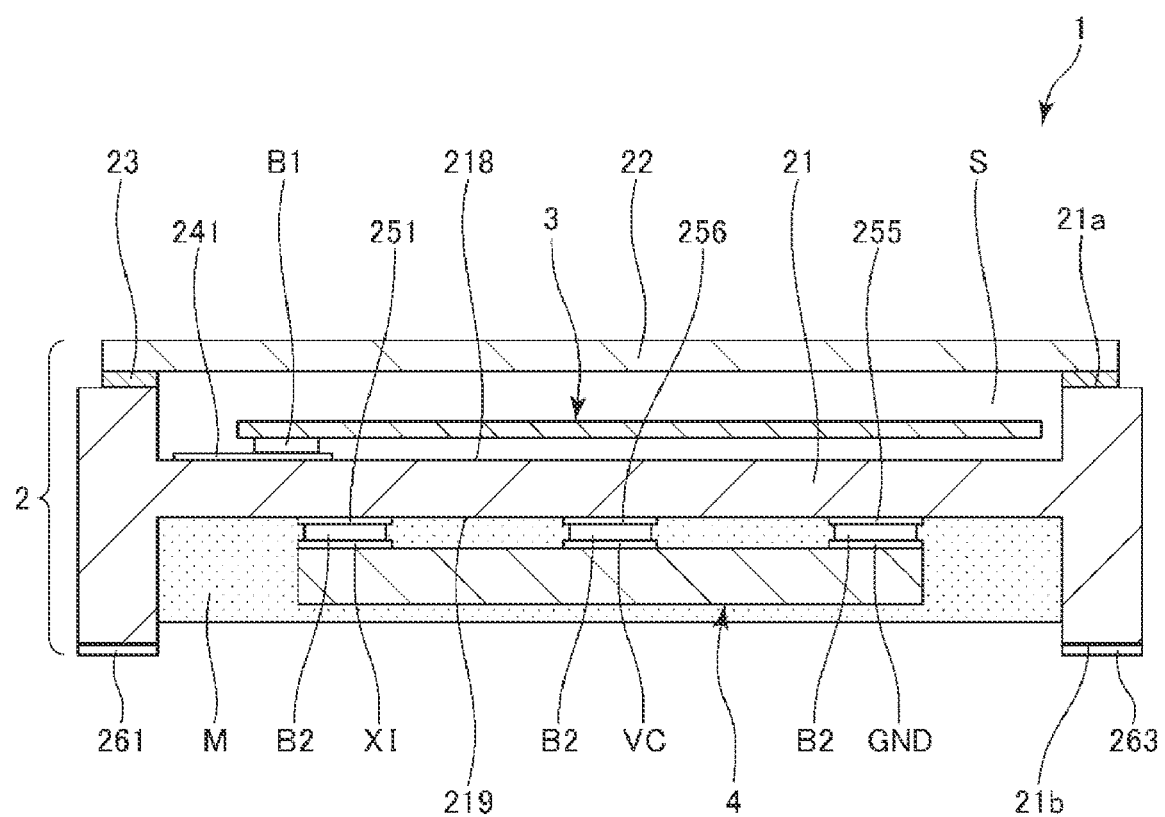
FIG. 8 is a cross-sectional view showing an oscillator according to a fourth embodiment.

FIG. 8 is a cross-sectional view showing an oscillator according to a fourth embodiment.

The oscillator 1 according to the present embodiment is substantially the same as the oscillator 1 according to the first embodiment described above except the point that the configuration of the package 2 is different. It should be noted that in the following description, the oscillator 1 according to the fourth embodiment will be described with a focus on the difference from the first embodiment described above, and the description of substantially the same issues will be omitted. Further, in FIG. 8, constituents substantially the same as in the embodiment described above are denoted by the same reference symbols.

As shown in FIG. 8, the base 21 has the upper surface 21a as a first principal surface and a lower surface 21b as a second principal surface, wherein the upper surface 21a and the lower surface 21b are in an obverse-reverse relationship. Further, the base 21 is provided with a first recessed part 218 opening in the upper surface 21a, and a second recessed part 219 opening in the lower surface 21b. Further, the first recessed part 218 and the second recessed part 219 are disposed so as to overlap each other in the plan view of the base 21. Further, the resonator element 3 is disposed in the first recessed part 218, and the integrated circuit 4 is disposed in the second recessed part 219.

Further, although only partially illustrated in FIG. 8, on a bottom surface of the first recessed part 218, there are disposed the internal terminals 241, 242 to be electrically and mechanically coupled to the resonator element 3 via the bonding members B1, on a bottom surface of the second recessed part 219, there are disposed the internal terminals 251 through 256 to be electrically and mechanically coupled to the integrated circuit 4 via the bonding members B2, and on the lower surface 21b of the base 21, there are disposed the external terminals 263 through 266.

According to such a configuration, it becomes possible to dispose the internal terminals 241, 242 and the internal terminals 251, 252 so as to be close to each other, or preferably so as to overlap each other, in a plan view. Therefore, the wiring lengths of the internal interconnections for electrically coupling the internal terminals 241, 242 and the internal terminals 251, 252 to each other can be made shorter compared to the first embodiment described above. Therefore, compared to the first embodiment described above, it becomes easy for the heat of the output circuit 44 to be transferred to the resonator element 3, and thus, the time T2 is shortened. Thus, the difference ΔT between the times T1, T2 becomes shorter, and thus, the temperature difference between the resonator element 3 and the temperature sensor 41 in the period until the thermal equilibrium state is achieved can be suppressed to a lower level. Therefore, the frequency of the oscillation signal VOUT is stabilized also in the period until the thermal equilibrium state is achieved.

Further, the lid 22 is bonded to the upper surface 21a of the base 21 via the bonding member 23 so as to close the opening of the first recessed part 218. By the lid 22 closing the opening of the first recessed part 218, the internal space S as an airtight space is formed inside the package 2, and the resonator element 3 is housed in the internal space S. Thus, it is possible to protect the resonator element 3 from an impact and an external environment, in particular, dust, water, moisture, and so on. It should be noted that the atmosphere in the internal space S is not particularly limited, but is set, for example, substantially the same as in the first embodiment described above. Further, the integrated circuit 4 is sealed with a molding material M. Thus, it is possible to protect the integrated circuit 4 from an impact and an external environment, in particular, dust, water, moisture, and so on.

As described above, the oscillator 1 according to the present embodiment has the base 21 which has the upper surface 21a as the first principal surface and the lower surface 21b as the second principal surface wherein the upper surface 21a and the lower surface 21b are in the obverse-reverse relationship, and which is provided with the first recessed part 218 opening in the upper surface 21a and the second recessed part 219 opening in the lower surface 21b, and the lid 22 which is bonded to the upper surface 21a of the base 21 so as to close the opening of the first recessed part 218. Further, the resonator element is disposed in the first recessed part 218, and the integrated circuit 4 is disposed in the second recessed part 219. According to such a configuration, it becomes easy for the heat of the output circuit 44 to be transferred to the resonator element 3 compared to, for example, the first embodiment described above. Therefore, the time T2 is shortened, and accordingly, the difference ΔT between the times T1, T2 becomes shorter, and thus, the temperature difference between the resonator element 3 and the temperature sensor 41 in the period until the thermal equilibrium state is achieved can be suppressed to a lower level. Therefore, the frequency deviation of the oscillation signal VOUT in the period from the startup until the thermal equilibrium state is achieved can be made smaller.

According also to such a fourth embodiment as described above, there can be exerted substantially the same advantages as in the first embodiment described above.

Fifth Embodiment

Figure 9:
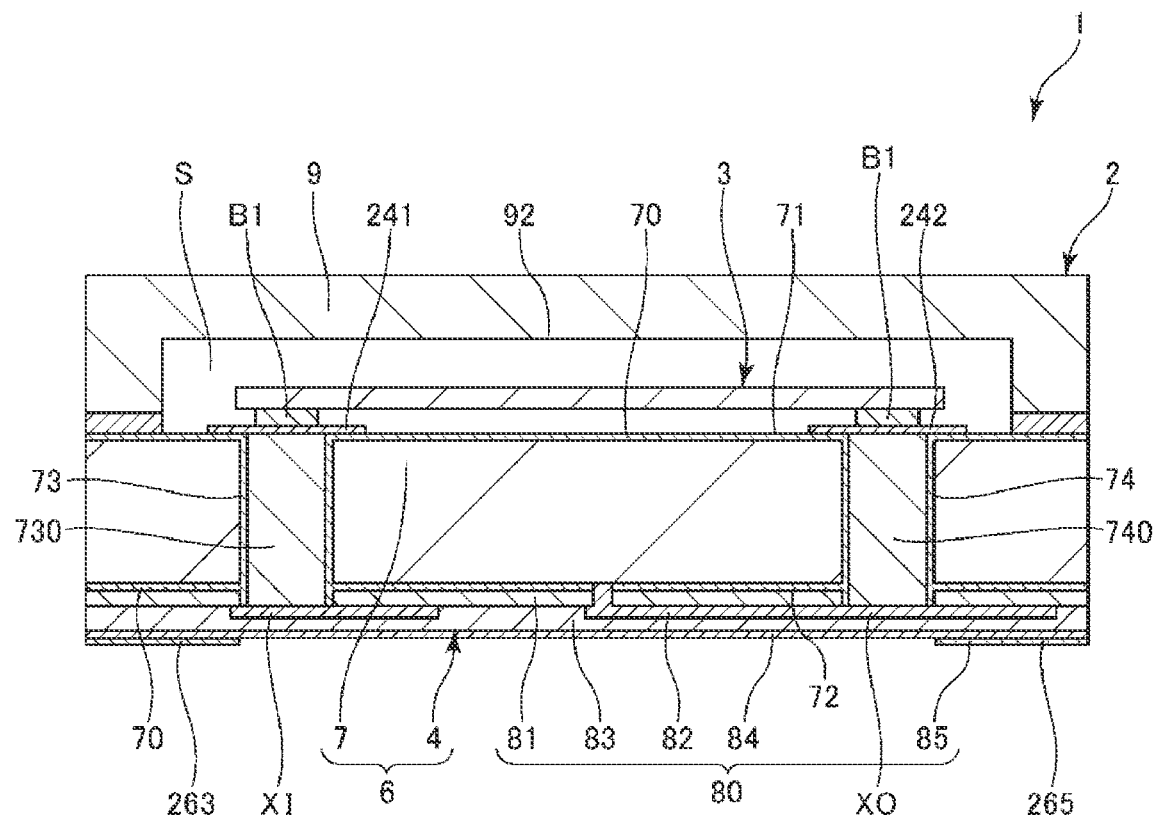
FIG. 9 is a cross-sectional view showing an oscillator according to a fifth embodiment.

FIG. 9 is a cross-sectional view showing an oscillator according to a fifth embodiment. It should be noted that FIG. 9 corresponds to a cross-sectional view viewed from a lateral side of FIG. 1.

The oscillator 1 according to the present embodiment is substantially the same as the oscillator 1 according to the first embodiment described above except the point that the configuration of the package 2 is different. It should be noted that in the following description, the oscillator 1 according to the fifth embodiment will be described with a focus on the difference from the first embodiment described above, and the description of substantially the same issues will be omitted. Further, in FIG. 9, constituents substantially the same as in the embodiment described above are denoted by the same reference symbols.

As shown in FIG. 9, the package 2 has a semiconductor circuit board 6 and a lid 9 bonded to the semiconductor circuit board 6.

Further, the semiconductor circuit board 6 has a semiconductor substrate 7 and the integrated circuit 4. The semiconductor substrate 7 is a silicon substrate. It should be noted that the semiconductor substrate 7 can be a semiconductor substrate other than the silicon substrate such as a variety of types of semiconductor substrate formed of, for example, germanium, gallium arsenide, gallium arsenide phosphide, gallium nitride, or silicon carbide. Further, the semiconductor substrate 7 has an upper surface 71 as a first principal surface and a lower surface 72 as a second principal surface, wherein the upper surface 71 and the lower surface 72 are in an obverse-reverse relationship, and the surfaces are covered with an insulating film 70. Further, at the lower surface 71 side of the semiconductor substrate 7, there is disposed the integrated circuit 4 electrically coupled to the resonator element 3, and at the upper surface 71 side, there is disposed the resonator element 3. By providing the integrated circuit 4 to the semiconductor substrate 7, it is possible to effectively using a space in the semiconductor substrate 7. Therefore, reduction in size of the oscillator 1 can be achieved.

On the lower surface 71 of the semiconductor substrate 7, there is disposed a stacked body 80 having an insulating layer 81, a wiring layer 82, an insulating layer 83, a passivation film 84, and a terminal layer 85 stacked on one another. Further, a plurality of active elements which is formed on the lower surface 71 and is not shown is electrically coupled via interconnections included in the wiring layer 82, and thus, the integrated circuit 4 is formed. Further, although only partially illustrated, the terminal layer 85 includes the external terminals 263 through 266.

It should be noted that although the single wiring layer 82 is included in the stacked body 80 in the illustrated configuration, this is not a limitation, and it is possible to stack two or more wiring layers 82 on one another via the insulating layers 83. In other words, it is possible to alternately stack the wiring layer 82 and the insulating layer 83 a plurality of times between the insulating layer 81 and the passivation film 84. Further, although in the illustrated configuration, the integrated circuit 4 is provided to the lower surface 71 of the semiconductor substrate 7, this is not a limitation, and it is possible for the integrated circuit 4 to be provided to the upper surface 72. According to the former configuration, since the space for forming the integrated circuit 4 becomes larger than in the latter configuration, the degree of design freedom of the integrated circuit 4 increases. In contrast, according to the latter configuration, since the integrated circuit 4 can be housed inside the internal space S, it is possible to protect the integrated circuit 4 from the environmental atmosphere, impacts, and so on.

Further, the semiconductor substrate 7 is provided with a pair of through holes 73, 74 penetrating in the thickness direction. These through holes 73, 74 are filled with an electrically-conductive material, and thus, through electrodes 730, 740 are formed. Further, on the upper surface 72 of the semiconductor substrate 7, there are disposed the internal terminals 241, 242 electrically coupled to the resonator element 3 via bonding members B1. Further, the internal terminal 241 is electrically coupled to the integrated circuit 4 via the through electrode 730, and the internal terminal 242 is electrically coupled to the integrated circuit 4 via the through electrode 740. It should be noted that the XI terminal in the present embodiment means a coupling portion between the through electrode 730 and the wiring layer 82, and the XO terminal means a coupling portion between the through electrode 740 and the wiring layer 82.

The lid 9 is a silicon substrate similarly to the semiconductor substrate 7. Thus, the semiconductor substrate 7 and the lid 9 become equal in linear expansion coefficient to each other to prevent the thermal stress caused by the thermal expansion from occurring, and thus, the oscillator 1 having the excellent vibration characteristics is achieved. Further, since it is possible to form the oscillator 1 using the semiconductor process, the oscillator 1 can accurately be manufactured, and at the same time, it is possible to achieve reduction in size thereof. Further, the lid 9 has a recessed part 92 which has a bottom and opens in the lower surface. Further, the resonator element 3 is housed in the recessed part 92. Further, the lid 9 is bonded to the upper surface 72 of the semiconductor substrate 7 in the lower surface. Thus, the internal space S for housing the resonator element 3 is formed between the lid 9 and the semiconductor circuit board 6.

As described above, the oscillator 1 according to the present embodiment has the semiconductor substrate 7 which has the upper surface 71 as the first principal surface and the lower surface 72 as the second principal surface wherein the upper surface 71 and the lower surface 72 are in the obverse-reverse relationship, and which is provided with the integrated circuit 4 formed on the upper surface 71 or the lower surface 72, the resonator element 3 disposed at the upper surface 71 side, and the lid 9 bonded to the semiconductor substrate 7 so as to cover the resonator element 3. As described above, by providing the integrated circuit 4 to the semiconductor substrate 7, it is possible to effectively using a space in the semiconductor substrate 7. Therefore, reduction in size of the oscillator 1 can be achieved.

Sixth Embodiment

Figure 10:
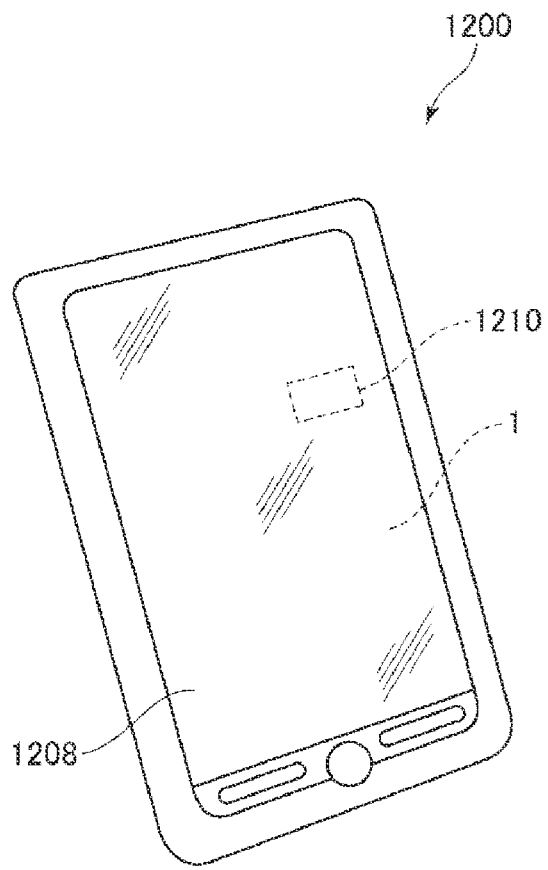
FIG. 10 is a perspective view showing a smartphone according to a sixth embodiment.

FIG. 10 is a perspective view showing a smartphone according to a sixth embodiment.

The electronic apparatus according to the present disclosure is implemented in the smartphone 1200 shown in FIG. 10. The smartphone 1200 has the oscillator 1 and a processing circuit 1210 which operates based on the oscillation signal VOUT from the oscillator 1. The processing circuit 1210 changes a display screen, starts up a specific application, sounds a warning tone or a sound effect, or drives a vibrating motor to vibrate a main body based on, for example, an input signal input from a screen 1208.

The smartphone 1200 as such an electronic apparatus is provided with the oscillator 1 and the processing circuit 1210 which operates based on the oscillation signal VOUT. Therefore, it is possible to appreciate the advantages of the oscillator 1 described above, and the high reliability can be exerted.

It should be noted that besides the smartphone 1200 described above, the electronic apparatus provided with the oscillator 1 can be applied to, for example, a personal computer, a digital still camera, a tablet terminal, a timepiece, a smart watch, an inkjet printer, a television set, a wearable terminal such as a pair of smart glasses or an HMD (head-mounted display), a video camera, a video cassette recorder, a car navigation system, a drive recorder, a personal digital assistance, an electronic dictionary, an electronic translator, an electronic calculator, a computerized game machine, a toy, a word processor, a workstation, a video phone, a security video monitor, electronic binoculars, a POS terminal, medical equipment, a fish finder, a variety of measurement instruments, equipment for a mobile terminal base station, a variety of gauges for a vehicle, a railroad wheel, an airplane, a helicopter, a ship, or a boat, a flight simulator, and a network server.

Seventh Embodiment

Figure 11:
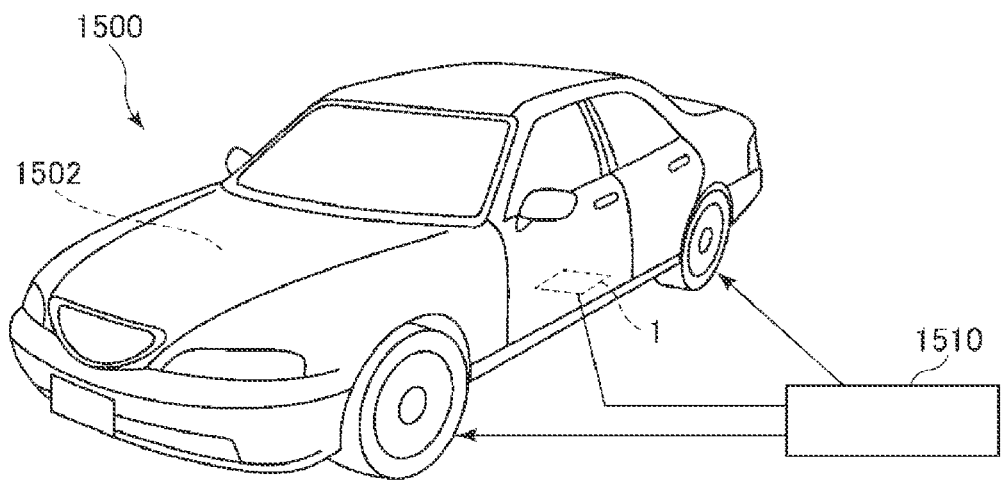
FIG. 11 is a perspective view showing a car according to a seventh embodiment.

FIG. 11 is a perspective view showing a car according to a seventh embodiment.

The car 1500 shown in FIG. 11 is an application of the vehicle according to the present disclosure. The car 1500 includes systems 1502 such as an engine system, a brake system, and a keyless entry system. Further, the car 1500 is provided with the oscillator 1 and a processing circuit 1510 which operates based on the oscillation signal VOUT from the oscillator 1 to control the systems 1502.

As described above, the car 1500 as the vehicle is provided with the oscillator 1 and the processing circuit 1510 which operates based on the oscillation signal VOUT. Therefore, it is possible to appreciate the advantages of the oscillator 1 described above, and the high reliability can be exerted.

It should be noted that the vehicle equipped with the oscillator 1 can also be, for example, a robot, a drone, a two-wheeled vehicle, an airplane, a ship, a boat, an electric train, a rocket, or a space vehicle besides the car 1500.

Although the integrated circuit, the oscillator, the electronic apparatus, and the vehicle according to the present disclosure are described based on the illustrated embodiments, the present disclosure is not limited to these embodiments, but the configuration of each of the constituents can be replaced with those having substantially the same function and an arbitrary configuration. Further, the present disclosure can also be added with any other constituents. Further, the present disclosure can be a combination of any two or more configurations of the embodiments described above.

What is claimed is:

1. An integrated circuit comprising:
a first coupling terminal and a second coupling terminal disposed along a first side;
an oscillation circuit which is electrically coupled to a resonator element via the first coupling terminal and the second coupling terminal;
a temperature sensor;
a temperature compensation circuit configured to compensate a temperature characteristic of the resonator element based on an output signal of the temperature sensor; and
an output circuit configured to receive a signal output from the oscillation circuit and output an oscillation signal, the output circuit being located between the first coupling terminal and the second coupling terminal in a plan view, wherein
d1<d0 and d2<d0, in which
an end-to-end distance between the temperature sensor and the output circuit is d0,
an end-to-end distance between the first coupling terminal and the output circuit is d1, and
an end-to-end distance between the second coupling terminal and the output circuit is d2.
2. An oscillator comprising:
the integrated circuit according to claim 1; and
the resonator element electrically coupled to the integrated circuit.
3. The oscillator according to claim 2, further comprising:
a base having a recessed part; and a lid bonded to the base so as to close an opening of the recessed part, wherein
the integrated circuit and the resonator element are disposed in the recessed part.
4. The oscillator according to claim 2, further comprising:
a base which has a first principal surface and a second principal surface in an obverse-reverse relationship, and which is provided with a first recessed part opening in the first principal surface and a second recessed part opening in the second principal surface; and
a lid bonded to the first principal surface of the base so as to close an opening of the first recessed part, wherein
the resonator element is disposed in the first recessed part, and
the integrated circuit is disposed in the second recessed part.
5. The oscillator according to claim 2, further comprising:
a semiconductor substrate which has a first principal surface and a second principal surface in an obverse-reverse relationship, and which is provided with the integrated circuit formed on one of the first principal surface and the second principal surface; and
a lid bonded to the semiconductor substrate so as to cover the resonator element, wherein
the resonator element is disposed at the first principal surface side.
6. An electronic apparatus comprising:
the oscillator according to claim 2; and
a processing circuit configured to operate based on the oscillation signal.
7. A vehicle comprising:
the oscillator according to claim 2; and
a processing circuit configured to operate based on the oscillation signal.
8. An integrated circuit comprising:
a first coupling terminal and a second coupling terminal disposed along a first side;
an oscillation circuit which is electrically coupled to a resonator element via the first coupling terminal and the second coupling terminal;
a temperature sensor disposed so as to be shifted toward a second side opposed to the first side;
a temperature compensation circuit configured to compensate a temperature characteristic of the resonator element based on an output signal of the temperature sensor; and
an output circuit configured to receive a signal output from the oscillation circuit and output an oscillation signal, wherein
d1<d0 and d2<d0, in which
an end-to-end distance between the temperature sensor and the output circuit is d0,
an end-to-end distance between the first coupling terminal and the output circuit is d1, and
an end-to-end distance between the second coupling terminal and the output circuit is d2.
9. An oscillator comprising:
the integrated circuit according to claim 8; and
the resonator element electrically coupled to the integrated circuit.
10. An integrated circuit comprising:
a first coupling terminal and a second coupling terminal disposed along a first side;
a third coupling terminal and a fourth coupling terminal disposed along a third side which couples one ends of the first side and a second side opposed to the first side to each other;

a fifth coupling terminal and a sixth coupling terminal disposed along a fourth side which couples other ends of the first side and the second side to each other;

an oscillation circuit which is electrically coupled to a resonator element via the first coupling terminal and the second coupling terminal;

a temperature sensor;

a temperature compensation circuit configured to compensate a temperature characteristic of the resonator element based on an output signal of the temperature sensor; and an output circuit configured to receive a signal output from the oscillation circuit and output an oscillation signal, wherein $d1<d0$ and $d2<d0$, in which an end-to-end distance between the temperature sensor and the output circuit is $d0$, an end-to-end distance between the first coupling terminal and the output circuit is $d1$, and an end-to-end distance between the second coupling terminal and the output circuit is $d2$.

11. The integrated circuit according to claim 10, wherein the third coupling terminal is a terminal which is electrically coupled to the output circuit, and to which the oscillation signal is output, and the third coupling terminal is located at one side of a central axis and the temperature sensor is located at the other side, wherein the central axis is defined as an axis which is perpendicular to the first side, and which passes through a center of the integrated circuit in a plan view.

12. The integrated circuit according to claim 10, wherein the third coupling terminal and the fifth coupling terminal, and the fourth coupling terminal and the sixth coupling terminal are each disposed along a direction in which the first coupling terminal and the second coupling terminal are arranged side by side, and $D1<D2$ and $D1<D3$, in which an end-to-end distance between the first coupling terminal and the second coupling terminal is $D1$, an end-to-end distance between the third coupling terminal and the fifth coupling terminal is $D2$, and an end-to-end distance between the fourth coupling terminal and the sixth coupling terminal is $D3$.

13. The integrated circuit according to claim 10, wherein $d4<d0$ and $d6<d0$, in which an end-to-end distance between the output circuit and the fourth coupling terminal is $d4$, and an end-to-end distance between the output circuit and the sixth coupling terminal is $d6$.

14. The integrated circuit according to claim 10, wherein $d3<d0$ and $d5<d0$, in which an end-to-end distance between the output circuit and the third coupling terminal is $d3$, and an end-to-end distance between the output circuit and the fifth coupling terminal is $d5$.

15. An oscillator comprising:

the integrated circuit according to claim 10; and the resonator element electrically coupled to the integrated circuit.

* * * * *